United States Patent [19]
Gaudenzi et al.

[11] Patent Number: 4,585,953
[45] Date of Patent: Apr. 29, 1986

[54] LOW POWER OFF-CHIP DRIVER CIRCUIT

[75] Inventors: Gene J. Gaudenzi, Purdys; John P. Norsworthy, Fishkill, both of N.Y.; Nghia V. Phan, Rochester, Minn.; Dennis C. Reedy, Stormville, N.Y.

[73] Assignee: International Business Machines Corporation, Armonk, N.Y.

[21] Appl. No.: 515,419

[22] Filed: Jul. 20, 1983

[51] Int. Cl.$^4$ ............................................. H03K 17/60
[52] U.S. Cl. ................................. 307/270; 307/254; 307/300; 307/443; 307/456
[58] Field of Search ................ 307/443, 475, 455–456, 307/549, 254, 270, 300; 330/257, 288

[56] References Cited

U.S. PATENT DOCUMENTS

| | | | |
|---|---|---|---|
| 3,491,251 | 1/1970 | Witsell | 307/443 |
| 3,553,486 | 1/1971 | Dow | 307/443 |
| 3,602,735 | 8/1971 | Lodi | 307/456 |
| 3,609,405 | 9/1971 | Surprise et al. | 307/263 |
| 3,619,659 | 11/1971 | Meyer et al. | 307/263 |
| 3,656,004 | 4/1972 | Kemerer | 307/246 |
| 3,710,145 | 1/1973 | Williamson et al. | 307/270 |
| 3,735,572 | 5/1973 | Tu | 307/456 X |
| 3,805,090 | 4/1974 | Kaiser | 307/443 |
| 3,824,408 | 7/1974 | Brunel | 307/270 X |
| 3,858,059 | 12/1974 | Khanna | 307/270 X |
| 3,959,665 | 5/1976 | Gilbreath et al. | 307/270 X |
| 3,996,482 | 12/1976 | Lockwood | 307/279 X |
| 4,016,431 | 4/1977 | Henle et al. | 307/270 X |
| 4,063,116 | 12/1977 | Schmoock | 307/254 |
| 4,071,783 | 1/1978 | Knepper | 307/270 |
| 4,092,551 | 5/1978 | Howard et al. | 307/254 |
| 4,167,649 | 9/1979 | Ohsawa et al. | 307/270 X |
| 4,251,737 | 2/1981 | Gaudenzi | 307/270 |
| 4,251,742 | 2/1981 | Beelitz | 307/270 X |
| 4,301,383 | 11/1981 | Taylor | 307/585 |
| 4,321,490 | 3/1982 | Bechdolt | 307/456 |
| 4,330,723 | 5/1982 | Griffith | 307/456 |
| 4,346,312 | 8/1982 | Christopherson | 307/475 X |

OTHER PUBLICATIONS

Patent Abstracts of Japan, vol. 2, No. 102, Aug. 23, 1978 & JP-A-53-68064 (Fujitsu K.K.) 6-17-1978.
Patent Abstracts of Japan, vol. 7, No. 94, Aug. 20, 1983, p. 5257 e78; & JP-A-58-19032 (Nippon Denki K.K.).
Patent Abstracts of Japan, vol. 7, No. 129, Jun. 4, 1983; & JP-A-58-44821 (Nippon Denki K.K.) 3-15-1983.
IBM Technical Disclosure Bulletin, vol. 17, No. 10, Mar. 1975, p. 2920.
IBM Technical Disclosure Bulletin, vol. 25, No. 3A, Aug. 1982, pp. 999–1000; No. 12, May 1983, pp. 6632–6633.
IBM Technical Disclosure Bulletin, vol. 18, No. 11, Apr. 1976, Slowing the Rise Time of Unterminated Emitter-Follower Drivers, by Y. R. Gopalakrishna et al.
IBM Technical Disclosure Bulletin, vol. 17, No. 10, Mar. 1975, Saturated Off-Chip Driver for Low-Power Application, by K. F. Mathews and Y. R. Gopalakrishna.

Primary Examiner—Stanley D. Miller
Assistant Examiner—D. R. Hudspeth
Attorney, Agent, or Firm—Sughrue, Mion, Zinn, Macpeak & Seas

[57] ABSTRACT

Power dissipation in an off-chip driver circuit is decreased by utilizing a selectively switched transistor to discharge the base of the output pull-down transistor, and by using a large resistance in the base current path for the first stage of the Darlington pull-up transistors. An additional transistor having a larger emitter area and coupled to a lower potential source is connected in parallel with the normal phase-splitter transistor to provide additional output current sinking capability, and a current mirror is connected to control the current through both the phase splitting transistor and the additional transistor to control the turn-on transition of the pull-down output transistor.

14 Claims, 4 Drawing Figures

DRIVER CIRCUIT

FIG.1  DRIVER CIRCUIT
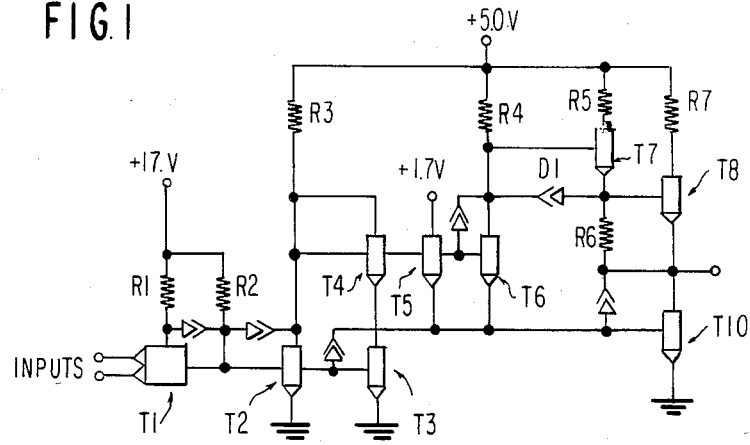
FIG.2  OPEN COLLECTOR VARIATION
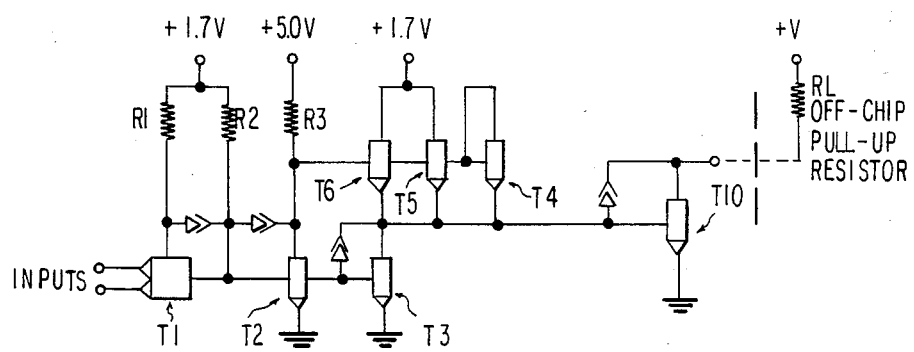

LOW POWER OFF-CHIP DRIVER CIRCUIT

BACKGROUND OF THE INVENTION

This invention relates to a high speed logic driver circuit, and more particularly to such a driver circuit especially suitable for high density integration. Still more particularly, the present invention is directed to a driver circuit having very low power consumption and controlled output transition times.

Push-pull and open collector driver circuits are widely used in data processing systems, examples of push-pull driver circuits being found in U.S. Pat. No. 4,251,737 issued Feb. 17, 1981 to Gaudenzi, U.S. Pat. No. 4,092,551 issued May 30, 1978 to Howard et al, U.S. Pat. No. 4,071,783 issued Jan. 31, 1978 to Knepper and U.S. Pat. No. 4,016,431 issued Apr. 5, 1977 to Henle et al, all of which are commonly assigned to the assignee of the present application. Examples of open collector driver circuits can be found, for example, in the above-cited U.S. Patent to Gaudenzi and in Mathews et al, SATURATED OFF-CHIP DRIVER FOR LOW-POWER APPLICATION, IBM Technical Disclosure Bulletin, Vol. 17, No. 10, March 1975, page 2920.

In past years, emphasis has been placed on improving the operating speeds of driver circuits. However, in very high-density, low-end master slices, low power dissipation is frequently of greater significance than high speed. Indeed, since most or all of the critical logic paths are on a single chip, all-out performance is usually not necessary. Instead, high input/output (I/O) count and heat removal constraints mandate low power dissipation.

A further troublesome characteristic encountered in many driver circuits is that the output transitions may be too fast, and this creates considerable noise on both off-chip nets and on-chip power distributions. The off-chip noise results in restrictive wiring rules.

SUMMARY OF THE INVENTION

It is therefore an object of the present invention to provide an off-chip driver circuit having decreased power consumption characteristics.

It is a further object of this invention to provide such a driver circuit in which the speeds of the transitions in the driver output are controlled.

Briefly, these and other objects of the present invention are achieved by a driver circuit in which the current supply to the pull-down driver output transistor is provided through a first transistor coupled to a relatively low potential source and a second control transistor coupled to a higher potential source through a relatively large resistance. The use of a large value for the resistor will decrease power dissipation, and the first transistor will provide the necessary current sinking capability for the pull-down output transistor while also conserving power due to its lower-valued potential source. Power dissipation is further reduced by using a switched transistor to discharge the base of the pull-down output transistor, rather than the commonly used discharge resistor.

In both push-pull and open collector embodiments of the present invention, an additional transistor is provided with a relatively large collector resistance and is connected in a current mirror fashion with the first and second control transistors. This limits the current supply to the base of the pull-down transistor output to a relatively low multiple of the current mirror resistance, thereby limiting the turn-on of the output transistor and controlling the down-going transition of the output. In the push-pull embodiment, the pull-up of the output is accomplished by a Darlington transistor pair, and the drive current to the Darlington pair is taken from the junction point between the second control transistor and its collector resistance. The turn-on time of the Darlington pair, and consequently the up-going transition of the driver output, is thus limited by the high collector resistance of the second control transistor.

BRIEF DESCRIPTION OF THE DRAWINGS

The invention will be more clearly understood from the following description in conjunction with the accompanying drawings, in which:

FIG. 1 is a brief schematic diagram of a push-pull driver circuit according to the present invention;

FIG. 2 is a schematic diagram of an open collector driver circuit according to the present invention;

DETAILED DESCRIPTION OF THE PREFERRED EMBODIMENT

Figure 4:
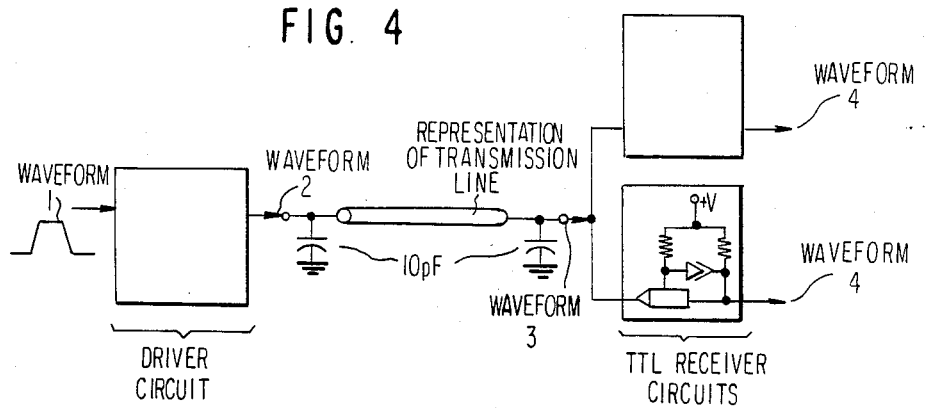
FIG. 4 is a wave form diagram illustrating measured results from the test configuration of FIG. 3.

The driver circuits according to the present invention are enhanced versions of typical drivers in low-end master slices, and the operation of such circuits is well known. The following description will therefore emphasize the novel features of the invention and will in some areas cover only as much of the conventional driver circuit operation as is necessary for a complete understanding of the invention.

FIG. 1 illustrates a push-pull off-chip driver circuit according to the present invention. As is well known, a low level output from the driver circuit is achieved by turning on the pull-down transistor $T_{10}$, and a high level driver output is achieved by turning on the pull-up Darlington transistor pair $T_7$, $T_8$. A phase splitter is used to provide 180° out-of-phase control signals to the pull-up and pulldown transistors, and this phase splitter includes the transistor $T_6$. When the transistor $T_6$ is conductive, the base potentials of the transistors $T_7$ and $T_8$ will be pulled down to thereby render these pull-up transistors non-conductive, while at the same time providing a base current to the transistor $T_{10}$ to render that transistor conductive. On the other hand, when the transistor $T_6$ is non-conductive, the base potentials of the transistors $T_7$, $T_8$ will be permitted to rise to a high level to render those transistors conductive and pull up the output of the driver circuit, and the supply of base current to the transistor $T_{10}$ will be cut off.

The distinctive features of the driver circuit of FIG. 1 will now be described. First of all, most conventional driver circuits employ a resistor coupled between ground and the base of transistor $T_{10}$ in order to discharge the base of that transistor when the driving current through transistor $T_6$ is cut-off. Such a discharge resistor, however, will also carry current during the time that the transistor $T_{10}$ is being driven into conduction, thus resulting in unnecessary power dissipation. Further, it is difficult to discharge the base of transistor 10 quickly enough using a resistor, and any attempt to do so by lowering the value of the discharge resistor will increase the power dissipated by that resistor during the on state of the transistor $T_{10}$. In the driver circuit according to the present invention, the discharge resistor is replaced by the transistor $T_3$, which is driven 180° out-of-phase with respect to the phase-splitting transistor $T_6$. Accordingly, when the transistor $T_6$ is conductive to provide the base driving current to the transistor $T_{10}$, the transistor $T_3$ is non-conductive. All of the current will therefore be provided to the base of transistor $T_{10}$, rather than wasting a portion of that current in a pull-down resistor. When the transistor $T_6$ becomes non-conductive, transistor $T_3$ turns on to discharge the base of transistor $T_{10}$. Thus, the base of the output transistor $T_{10}$ is itself push-pull driven.

A second distinctive feature of the invention concerns the source of drive current to the pull-down transistor $T_{10}$. In a conventional driver, transistor $T_6$ would provide the base drive current to the transistor $T_{10}$. The resistor $R_4$ had to have a small value, since a large-valued resistor would not provide transistor $T_{10}$ with sufficient output current sinking capability and would also delay the turn-on time of that transistor. In the circuit of FIG. 1, however, additional transistors $T_4$ and $T_5$ are available for providing the base drive current to the output pull-down transistor $T_{10}$, so that the transistor $T_6$ can be used primarily for controlling the on or off state of the Darlington pull-up transistor pair $T_7$, $T_8$. More particularly, when a transition is to be made from a low level driver output to a high level driver output, the transistor $T_6$ is rendered non-conductive. The high resistance of resistor $R_4$ will limit the base drive current to the transistor $T_7$, thereby limiting the up-going transition in the driver output. It should also be pointed out that a large value for the resistor $R_4$ will decrease the amount of current which must be drawn off by the transistor $T_6$ in order to turn off the transistors $T_7$, $T_8$.

Since a large resistance value is used for the resistor $R_4$, the base current to the transistor $T_{10}$ would ordinarily be inadequate for sufficient output current sinking capability. To compensate for this problem, an additional transistor $T_5$ is provided for supplying base drive current to the transistor $T_{10}$. The transistor $T_5$ has no collector resistor and is designed to have a larger emitter area than the transistor $T_6$, and therefore exhibits a lower output impedance. In addition, it is coupled to a lower supply voltage, +1.7 V, thus providing additional power savings.

The purpose of the transistor $T_4$ is to limit instantaneous current surges through the transistors $T_5$ and $T_6$. In a conventional driver circuit arrangement, the connection point between the resistor $R_3$ and the transistor $T_2$ would be connected directly to the base of the transistor $T_6$, and the transistors $T_4$ and $T_5$ would not be included. With such an arrangement, any surge in the current through the resistor $R_3$ would be amplified by the $\beta$ of the transistor $T_6$, thus resulting in large surges in the base drive current to the pulldown output transistor $T_{10}$. By connecting transistor $T_4$ as a diode in FIG. 1, the current through the resistor $R_3$ becomes a collector current of the transistor $T_4$ and will not be multiplied by the $\beta$ of transistor $T_4$. Further, with the bases of the transistors $T_4$-$T_6$ connected in common and with their emitters also connected in common, a current mirror is established, and this will limit the current through each of the transistors $T_5$ and $T_6$ to a value proportional to the current through the resistor $R_3$. By limiting the total base drive current to the transistor $T_{10}$ to a low multiple of the current through the resistor $R_3$, the turn-on time of the transistor $T_{10}$ will be limited, thereby controlling the down-going transition in the driver output.

The overall operation of the driver circuit of FIG. 1 will be easily understood from the above description. For high-level input signals, transistors $T_1$, $T_4$, $T_5$, $T_6$ and $T_{10}$ are all off, while transistors $T_2$, $T_3$, $T_7$ and $T_8$ are all on, resulting in a high-level driver output. Then the input changes from a high to a low level, the transistor $T_2$ turns off and the transistors $T_4$-$T_6$ begin to conduct. Since the combined current of the transistors $T_4$-$T_6$ is limited to a low multiple of the current through the resistor $R_3$, the turn-on time of the transistor $T_{10}$ is limited, thereby controlling the down-going transition in the driver output signal.

For a low-level input signal, transistors $T_1$, $T_4$, $T_5$, $T_6$ and $T_{10}$ are all on, while transistors $T_2$, $T_3$, $T_7$ and $T_8$ are off, resulting in a low-level driver output. When the input changes from a low to a high level, a transistor $T_2$ turns on to consequently turn off the transistors $T_4$-$T_6$, and the transistor $T_3$ turns on to discharge the base of the transistor $T_{10}$ and render that transistor non-conductive. The large value of resistance $R_4$ limits the base current to the transistor $T_7$, thereby limiting the turn-on time of the Darlington pair $T_7$, $T_8$ and controlling the up-going transition in the driver output signal.

The driver circuit illustrated in FIG. 1 dissipates 3.8 mW nominally, when the following resistor values are employed: $R1=10$ K, $R2=2$ K, $R3=13.6$ K, $R4=16.7$ K, $R5=0.6$ K, $R6=5$ K, and $R7=0.03$ K.

FIG. 2 illustrates an open collector embodiment of the driver circuit according to the present invention, which is substantially the same as the embodiment of FIG. 1 after removing the circuit components required for the pull-up Darlington pair, i.e. resistors $R_4$-$R_7$, transistors $T_7$, $T_8$ and diode $D_1$. The operation of the circuitry of FIG. 2 will be readily apparent, and can be briefly described as follows. For a high level input, transistor $T_2$ will be conducting to lower the base potential for transistors $T_4$-$T_6$ and therefore turn these transistors off. Transistor $T_3$ will be conducting to discharge the base of the pull-down output transistor $T_{10}$, thereby turning off the transistor $T_{10}$. This will allow the output potential of the driver circuit to be raised through the off-chip pull-up resistor RL. (This is typically slow enough so that there is no need to provide additional control over the up-going transition.) During transition from a high to a low level input, the transistor $T_2$ will turn off and permit a base current to be provided to the transistors $T_4$-$T_6$ through the resistor $R_3$ having a relatively high resistance value. The Darlington pull-up transistor pair $T_7$, $T_8$ is not present in the open collector embodiment, and the transistor $T_6$ is therefore no longer needed to control the on and off states of the pull-up transistors. Accordingly, both of transistors $T_5$ and $T_6$ can be connected to the +1.7 V source to provide the desired base drive current to the transistor $T_{10}$ with a decreased power dissipation. The transistor $T_4$ performs the same current-limiting function as in the embodiment of FIG. 1, thereby controlling the pull-down transition in the drive output. As in the embodiment of FIG. 1, the transistor $T_3$ will turn off for a low level input, thereby permitting all of the current from the transistors $T_4$-$T_6$ to be provided as a base drive current to the transistor $T_{10}$.

During the transition from low level to high level inputs, the transistors $T_2$ and $T_3$ will turn-on, the latter transistor discharging the base of the pull-down output transistor $T_{10}$ and allowing the driver output to be pulled up. The turning on of transistor $T_2$ will discharge the bases of the phase-splitter transistors $T_4$-$T_6$, thereby cutting off the base current supply to the transistor $T_{10}$.

Figure 3:
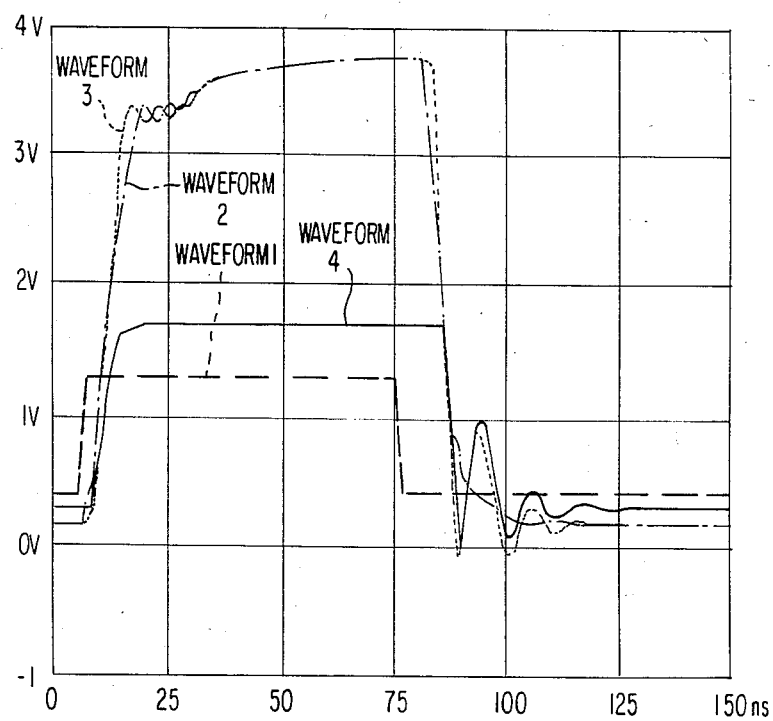
FIG. 3 is a brief diagram of a test configuration for evaluating the driver circuit according to the present invention.

Testing of the embodiment of FIG. 1 was computer simulated for a configuration as illustrated in FIG. 4, and the results were as illustrated in FIG. 3. As can be seen from FIG. 3, the driver circuit according to the present invention exhibits an average delay of approximately 12 ns. Further, it does so with relatively little off-chip noise and reduced power dissipation.

We claim:

1. A driver circuit for interfacing between relatively small electrical loads on-chip and relatively larger electrical loads off-chip such as bipolar gate arrays, said driver circuit including a first potential source for generating logic levels to go off-chip, and a second potential source lower than said first potential source, said driver circuit being of the type including a pull-down output transistor having an emitter, base and collector, said pull-down output transistor passing a low potential from its emitter to its collector to provide a low potential driver circuit output at its collector in response to a drive current received at its base, and control means responsive to an input signal for providing said drive current to said base of said pull-down output transistor, said control means comprising a drive current supply transistor having an emitter coupled to said base of said pull-down output transistor, a collector coupled to said second potential source, and a base, and means for providing said first potential to said base of said drive current supply transistor in accordance with said driver circuit input signal.

2. A driver circuit of the type including a first potential source, a first output switch means, coupled to said first potential and having a control terminal and an output terminal, for selectively turning on to provide said first potential at its output terminal in response to a first control signal at its control terminal, and control means responsive to an input signal for providing said control signal to said control terminal, said control means comprising:
   a drive current supply transistor for selectively providing current to said control terminal as said control signal; and
   a current mirror transistor connected in current mirror fashion with said drive current supply transistor for controlling the current flowing through said drive current supply transistor.

3. A driver circuit of the type including a source of first a potential, a first output switch means coupled to said first potential and having a first control terminal and an output terminal, said first output switch means selectively turning on to provide said first potential at its output terminal in response to a first control signal at its first control terminal, and push-pull drive means responsive to an input signal for providing said first control signal to said first control terminal, said push-pull drive means comprising a first supply voltage; first transistor means coupled to said first supply voltage for providing current to said first control terminal in accordance with a first switching signal, second transistor means for drawing current from said first control terminal in accordance with a second switching signal, and means responsive to said input signal for providing out-of-phase first and second switching signals to said first and second transistor means, respectively, said first transistor means comprising a drive current supply transistor ($T_5$) for selectively coupling said first supply voltage to said first control terminal, and a current mirror circuit for controlling the current flowing through said drive current supply transistor.

4. A driver circuit as defined in claim 3, wherein said current mirror circuit comprises a current mirror transistor ($T_4$) having an input terminal coupled to a second supply voltage, a control terminal receiving said first switching signal and an output terminal for selectively coupling said second supply voltage to said first control terminal in accordance with said first switching signal, said drive current supply transistor having an input terminal coupled to said first supply voltage, a control terminal receiving said first switching signal, and an output terminal for selectively coupling said first supply voltage to said first control terminal in accordance with said first switching signal.

5. A driver circuit as defined in claim 4, further comprising second output switch means having a second control terminal and an output terminal and selectively turning on to provide a high potential at its output terminal in response to a second control signal at its second control terminal, said output terminal of said second output switch means being coupled in common with said output terminal of said first output switch means to form said driver circuit output, said push-pull drive means further comprising a pull-up control transistor ($T_6$) connected in current mirror fashion with said drive current supply transistor, said pull-up control transistor having its emitter coupled to said first control terminal, its collector coupled to said second control terminal and its base receiving said first switching signal.

6. A driver circuit, including a source of a first potential, a first output switch means coupled to said first potential and having a control terminal and an output terminal, said first output switch means selectively turning on to provide said first potential at its output terminal in response to a first control signal at its control terminal, and control means responsive to an input signal for providing said control signal to said control terminal, said control means comprising:
   a first voltage source;
   a second voltage source lower than said first voltage source;
   a drive current supply transistor having its collector coupled to said second voltage source for selectively providing current to said control terminal from said second voltage source as said control signal; and
   a current mirror circuit for controlling the current flowing through said drive current supply transistor, said current mirror circuit comprising a current mirror transistor having its collector coupled to said first voltage source for selectively providing current to said control terminal from said first voltage source.

7. A driver circuit as defined in claim 6, wherein the base emitter junction area of said drive current supply transistor is larger than that of said current mirror transistor.

8. A driver circuit as defined in claim 7, wherein said control means further comprises a discharge transistor ($T_3$) for discharging said control terminal.

9. A driver circuit as defined in claim 8, wherein said control means further comprises means for driving said current mirror transistor and said discharge transistor substantially 180° out-of-phase.

10. A driver circuit as defined in claim 6, wherein said current mirror circuit further comprises a resistor for coupling said collector of said current mirror transistor to said first voltage source, whereby the total current provided to said control terminal of said first output switch means is a multiple of the current through said resistor.

11. A driver circuit of the type including a source of a first potential, a first output switch means coupled to said first potential and having a first control terminal and an output terminal, said first output switch means selectively turning on to provide said first potential at its output terminal in response to a first control signal at its first control terminal, a source of a second potential, a second output switch means coupled to said second potential and having a second control terminal and a second output terminal, said second output switch means selectively turning on to provide said second potential at its output terminal in response to a second control signal at its second control terminal, and control means responsive to an input signal for providing said first and second control signals to said first and second control terminals, respectively, said control means comprising:
   a drive current supply transistor for selectively providing current to said first control terminal as said control signal;
   a current mirror circuit for controlling the current flowing through said drive current supply transistor; and
   a pull-up control transistor ($T_6$) having an emitter coupled to said first control terminal and a collector coupled to said second control terminal, the current through said pull-up control transistor being controlled by said current mirror circuit.

12. A low-power off-chip driver circuit, comprising:
   input logical circuit means for receiving a plurality of binary inputs and providing a binary output which is a predetermined logical function of said plurality of binary inputs;
   output circuit means for providing a driver circuit output in accordance with an output control signal, said output circuit means comprising an output transistor having a base for receiving a base drive signal as said output control signal; and
   control circuit means responsive to said binary output and electrically coupling said input logical circuit means to said output circuit means to provide said output control signal, said control circuit means including at least one transistor for providing said base drive current to said output circuit means and current mirror circuit means for controlling the current flowing through said at least one transistor to limit the speed of transitions in said driver circuit output.

13. A low-power off-chip driver circuit as defined in claim 12, wherein said control circuit means further comprises a discharge transistor for actively pulling down the base of said output transistor.

14. A low-power off-chip driver circuit, comprising:
   input logical circuit means for receiving a plurality of binary inputs and providing a binary output which is a predetermined logical function of said plurality of binary inputs;
   output circuit means for providing a driver circuit output in accordance with an output control signal, said output circuit means comprising a push-pull circuit including a pull-down output transistor having a base for receiving a base drive signal as said output control signal and a pull-up output transistor switching means operable in accordance with a control signal; and
   control circuit means responsive to said binary output and electrically coupling said input logical circuit means to said output circuit means to provide said output control signal, said control circuit means comprising: a first transistor for coupling a relatively low potential to the base of said pull-down output transistor with a relatively low impedance to provide said base drive current to said pull-down output transistor; a resistor; a second transistor receiving a relatively higher potential through said resistor and coupling said higher potential in common to said base of said pull-down output transistor, the control signal of said pull-up output transistor switching means being derived from the connection point between said resistor and said second transistor; and current mirror circuit means for controlling the current flowing through said first transistor to limit the speed of transitions in said driver circuit output.

* * * * *